United States Patent [19]
Robinson et al.

[11] Patent Number: 6,124,761
[45] Date of Patent: Sep. 26, 2000

[54] VARIABLE GAIN AMPLIFIER WITH GAIN LINEAR WITH CONTROL VOLTAGE

[76] Inventors: Trevor Robinson, 403 11th St., Apt. C; Pramote Piriyapoksombu, 1516 Pacific Coast Hwy., #106, both of Huntington Beach, Calif. 92648

[21] Appl. No.: 09/163,885

[22] Filed: Sep. 30, 1998

[51] Int. Cl.$^7$ ...................................................... H03F 3/45
[52] U.S. Cl. .......................... 330/254; 330/256; 327/356; 327/359
[58] Field of Search .................................... 330/254, 256; 327/356, 359

[56] References Cited

U.S. PATENT DOCUMENTS

| | | | |
|---|---|---|---|
| 3,684,974 | 8/1972 | Soloman et al. | 330/256 |
| 5,994,961 | 11/1999 | Lunn et al. | 330/256 |

Primary Examiner—Michael B Shingleton
Attorney, Agent, or Firm—Fish & Richardson P.C.

[57] ABSTRACT

A variable gain amplifier (VGA) having a control voltage source that provides high gain-to-control voltage linearity over at least an 80 dB gain range. Further, the gain curve for the VGA is essentially independent of temperature. In the preferred embodiment, the VGA includes a two-stage bipolar differential amplifier. Each stage is a transconductor followed by current steering. The first stage amplifier is coupled to an exponentially varying current source to change the transconductance of the stage. The second stage amplifier is coupled to an fixed current source to maintain a fixed transconductance for the stage. To obtain exponential current steering, the control signal for the current steering circuitry is pre-distorted by the following equation:

$$I/(1+\exp(-f(V_{CTRL}/V_T)))=I^*A^*\exp(V_{CTRL}/V_{REF}),$$

where A is a scaling factor, $V_T=kT/q$, and T is temperature in Kelvin. The invention includes a fast, inexpensive control voltage source that provides such a signal.

4 Claims, 2 Drawing Sheets

6,124,761

1

VARIABLE GAIN AMPLIFIER WITH GAIN LINEAR WITH CONTROL VOLTAGE

RELATED APPLICATIONS

This application is related to co-pending U.S. patent application Ser. No. 09/163,892 entitled "VARIABLE GAIN AMPLIFIER WITH HIGH LINEARITY AND LOW NOISE", filed Sep. 30, 1998, and assigned to the assignee of the present invention, the teachings of which are hereby incorporated by reference.

1. Technical Field

This invention relates to electronic circuits, and more particularly to an electronic variable gain amplifier having a control voltage source that provides high gain-to-control voltage linearity over a wide dB range and a gain curve that is essentially independent of temperature.

2. Background

In a radio frequency (RF) transceiver, the received signal has a high dynamic range (>80 dB). In order to supply a signal of constant amplitude to a baseband section of the transceiver, a variable gain amplifier (VGA) with equivalent or better dynamic range is required. While it is desirable that the VGA gain in decibels (dB) be linear with respect to a control voltage, there is a certain range of tolerable non-linearity in gain, usually specified by gain slope variation in dB/V over some gain segment. Known solutions fail to provide a VGA that has sufficient linearity in the high gain range (typically in the top 10 dB) that are all suitable for some applications (such as a code division multiple access (CDMA) transceiver).

Attempts have been made in the past to provide such linearity by using bipolar VGA's with current steering. However, current steering circuitry implemented in bipolar technology has a hyperbolic tangent characteristic instead of the desired exponential characteristic. Attempts have been made to use feedback circuits and read-only memory based look-up tables to generate appropriate control signals for such a circuit, but such approaches are relatively slow and expensive to implement.

Accordingly, the inventor has perceived that there is a need for a variable gain amplifier having a control voltage source that provides high gain-to-control voltage linearity over a wide dB range and a gain curve that is essentially independent of temperature. The present invention provides such an amplifier.

SUMMARY

The invention includes a variable gain amplifier (VGA) having a control voltage source that provides high gain-to-control voltage linearity over at least an 80 dB gain range. Further, the gain curve for the VGA is essentially independent of temperature.

In the preferred embodiment, the VGA includes a two-stage bipolar differential amplifier. Each stage is a transconductor followed by current steering. The first stage amplifier is coupled to an exponentially varying current source to change the transconductance of the stage. The second stage amplifier is coupled to an fixed current source to maintain a fixed transconductance for the stage.

Accordingly, to obtain exponential current steering, the control signal for the current steering circuitry is pre-distorted by the following equation:

$$I/(1+\exp(-f(V_{CTRL}/V_T))) = I^* A^* \exp(V_{CTRL}/V_{REF}),$$

where A is a scaling factor, $V_T = kT/q$, and T is temperature in Kelvin. The invention includes a fast, inexpensive control voltage source that provides such a signal.

2

In particular, in one aspect the invention includes a variable gain amplifier with high gain-to-control voltage linearity over a wide dB range, including: at least one differential amplifier stage having an amplifier section and a current steering section exhibiting a hyperbolic tangent characteristic; a voltage source, coupled to the current steering section of at least one differential amplifier stage, for generating a first control signal output proportional to $I_{EXP}$, and a second control signal output proportional to $I_{CONST} - I_{EXP}$, with $I_{CONST}$ being a constant current, and $I_{EXP}$ being exponentially related to an input control voltage $V_{CTRL}$ and independent of temperature, where the first and second control signal outputs control correct steering for the current steering section so that the current steering section has an exponential characteristic. In another aspect, the invention includes such a voltage source alone.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference numbers and designations in the various drawings indicate like elements.

DETAILED DESCRIPTION

Figure 1:
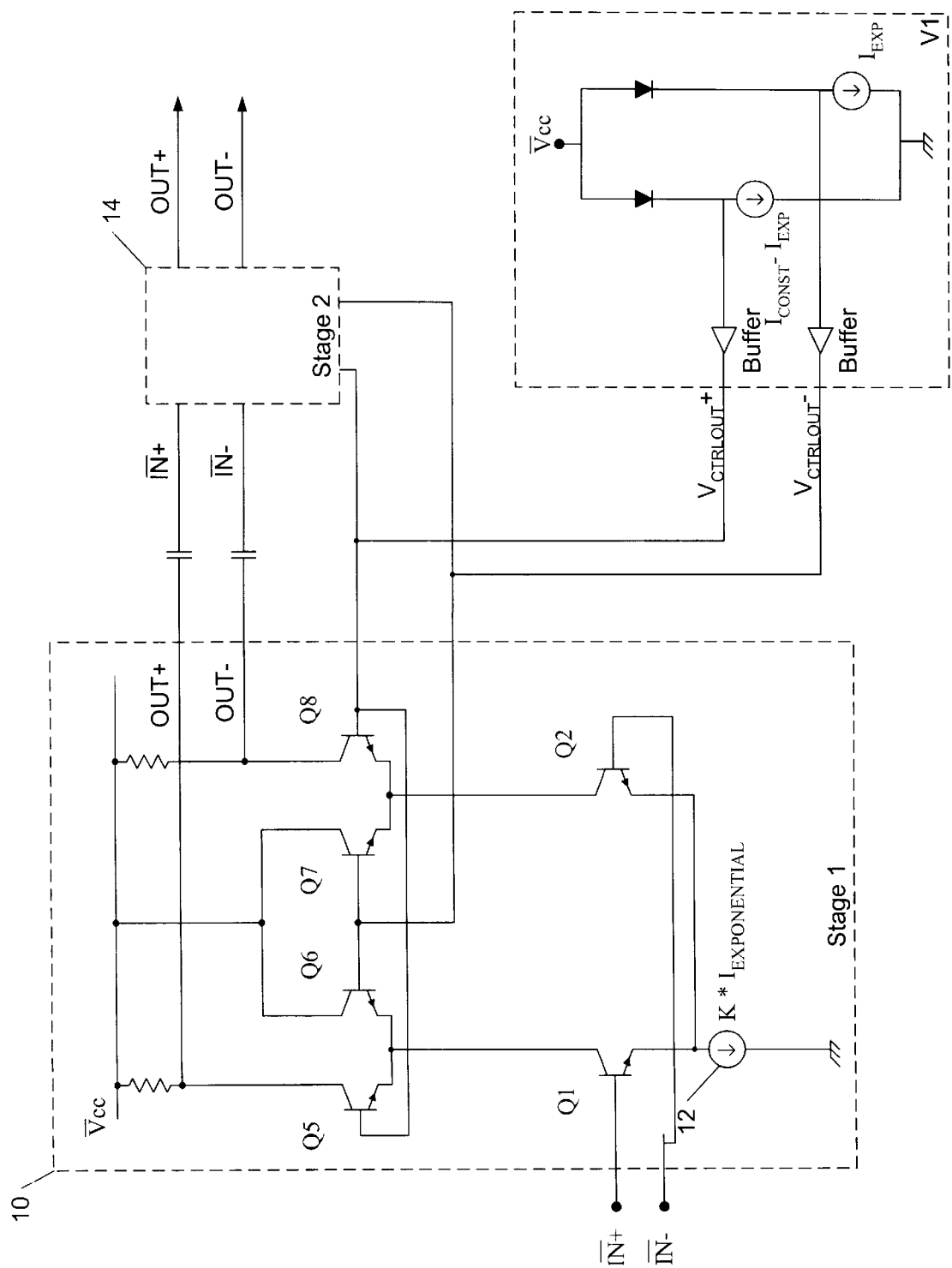
FIG. 1 is a schematic diagram of the preferred embodiment of the present invention.

FIG. 1 shows a schematic diagram of the amplifier section of one embodiment of the present invention. The amplifier section is shown as being implemented in bipolar circuitry. In the preferred embodiment, the VGA includes a two-stage bipolar differential amplifier. Each stage is a transconductor followed by current steering. The first stage amplifier 10 is coupled to an exponentially varying current source 12 to change the transconductance of the stage. More particularly, referring to the first stage amplifier 10, differential IF inputs $\overline{IN+}$, $\overline{IN-}$ are respectively coupled to the bases of transistors Q1 and Q2. Transistors Q1 and Q2, along with exponentially varying current source 12, form a first differential amplifier. The differential amplifier section of the second stage 14 is similar in construction, but uses a fixed current source to maintain a fixed transconductance for the stage. The second stage amplifier 14 is shown capacitively coupled to the output of the first stage amplifier 10.

For purposes of the present invention, the amplifier stages may be implemented in other configurations and have fewer or more stages. An example of another configuration for the amplifier stages is shown in the above-referenced co-pending U.S. patent application Ser. No. 09/163,892.

To improve the dynamic range of the variable gain amplifier, each the amplifier section of each stage 10, 14 is followed by corresponding current steering circuitry. More particularly, referring to the current steering circuitry of the first stage amplifier 10, paired transistors Q5–Q6 and Q7–Q8 act to steer the signal current from transistors Q1 and Q2, respectively, either to a voltage source $\overline{V}_{cc}$ (through transistors Q6 and Q7), or to loads coupled to outputs OUT+, OUT– (through transistors Q5 and Q8). The steering voltage signals $V_{CTRLOUT}+$ and $V_{CTRLOUT}-$ for transistors Q5, Q6, Q7, and Q8 are output by a voltage source V1. The current steering circuitry of the second stage 14 is similar in construction.

As noted above, current steering circuitry implemented in bipolar technology has a hyperbolic tangent characteristic. To obtain exponential steering, the control signal can be pre-distorted by the following equation:

$$I/(1+\exp(-f(V_{CTRL}/V_T)))=I^*A^*\exp(V_{CTRL}/V_{REF}),$$

where A is a scaling factor, $V_T$=kT/q, T is temperature in Kelvin, and $f$ is a function of $V_{CTRL}$.

Figure 2:
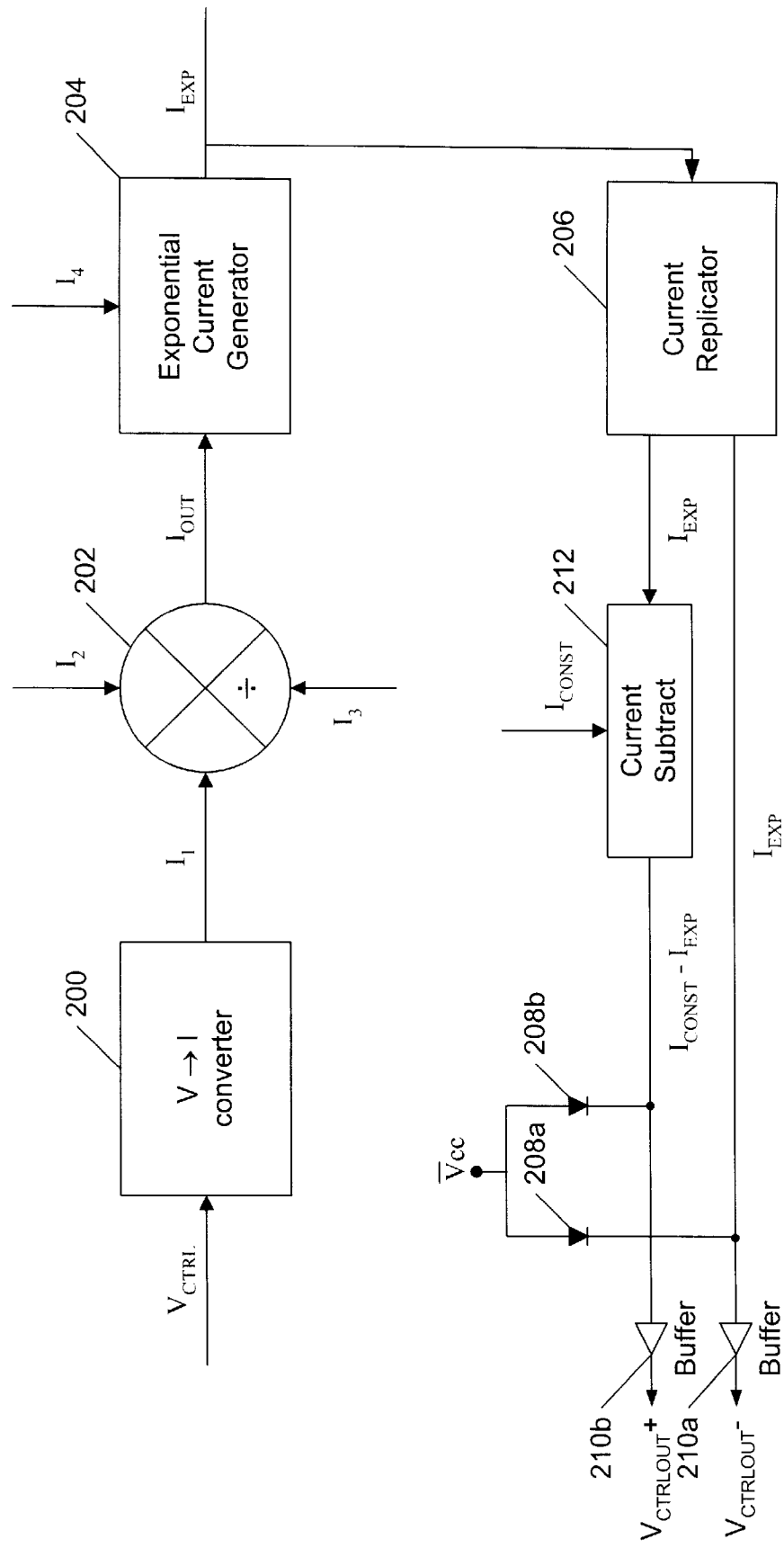
FIG. 2 is a block diagram of an exponential control signal generation circuit in accordance with the preferred embodiment of the present invention.

FIG. 2 is a block diagram of an exponential control signal generation circuit for generating the desired outputs for the voltage source V1. For ease of manufacture in conjunction with the amplifier stages 10, 14, this circuit is preferably implemented in bipolar circuitry. However, a comparable circuit can be implemented in other technologies, such as complimentary metal oxide semiconductor (CMOS) field effect transistors (FET). Accordingly, the embodiment shown in FIG. 2 should be taken as exemplary only.

A control voltage $V_{CTRL}$ is applied to a voltage-to-current converter 200 to generate a corresponding proportional current $I_1$ equal to $V_{CTRL}/R_1$, where $R_1$ is a resistance value selected empirically to scale the output current $I_1$ for a particular application. The current $I_1$ is applied to a translinear current multiplier/divider 202. The current multiplier/divider 202 has as additional inputs current $I_2$ from a proportional-to-absolute-temperature (PTAT) current source, and current $I_3$ from a constant (independent of temperature) current source. Examples of such current sources are shown in U.S. Pat. No. 5,774,013 to Groe, issued Jun. 30, 1998 and assigned to the assignee of the present invention. The current multiplier/divider 202 provides an output $I_{OUT}$ equal to $I_1^*I_2/I_3$, which can be expressed as $V_{CTRL}^*I_2/(R_1^*I_3)$. The output current $I_{OUT}$ is applied to an exponential current generator 204, which has as an additional input a constant current $I_4$. The exponential current generator 204 provides an output current $I_{EXP}$ that is exponentially related to $I_{OUT}$ and is independent of temperature. In particular, $I_{EXP}=I_4^*A^*\exp(I_{OUT}^*R_2/V_T)$, which can be expressed as $I_{EXP}=I_4^*A^*\exp(V_{CTRL}/V_{REF})$, where $1/V_{REF}=I_2^*R_2/(I_3^*R_1^*V_T)$, with A being a selectable scaling factor, and $R_2$ is a resistance value selected empirically to scale the output current $I_{EXP}$ for a particular application.

The output current $I_{EXP}$ from the exponential current generator 204 is coupled to a current replicator 206, which generates two essentially identical output currents equal to $I_{EXP}$. One output of the current replicator 206 provides current flow from a voltage source $\overline{V}_{CC}$ through a first diode 208a, thereby generating a control voltage $V_{CTRLOUT}-$ through a first buffer 210a that is coupled to the gates of transistors Q6 and Q7 in FIG. 1. The other output of the current replicator 206 is subtracted from a constant current $I_{CONST}$ by a current subtractor 212 to generate an output current $I_{CONST}-I_{EXP}$. The output current $I_{CONST}-I_{EXP}$ provides current flow from a voltage source $\overline{V}_{CC}$ through a second diode 208b, thereby generating a $V_{CTRLOUT}+$ control voltage through a second buffer 210b that is coupled to the gates of transistors Q5 and Q8 in FIG. 1. When the two output voltages $V_{CTRLOUT}-$, $V_{CTRLOUT}+$ from voltage source V1 are applied to the current steering pairs of transistors, gain in dB is proportional to $V_{CTRL}$.

Thus, the output of the voltage source V1 is a function of $V_{CTRL}$, and provides the desired pre-distorted control signals necessary to obtain exponential steering of the current steering circuitry. In one embodiment of invention, a VGA was fabricated having a gain-to-control voltage linearity over at least an 80 dB gain range. Further, the gain curve for this VGA was essentially independent of temperature.

A number of embodiments of the present invention have been described. Nevertheless, it will be understood that various modifications may be made without departing from the spirit and scope of the invention. Accordingly, other embodiments are within the scope of the following claims.

What is claimed is:

1. A variable gain amplifier, including:

at least one differential amplifier stage having an amplifier section and a current steering section exhibiting a hyperbolic tangent characteristic;

a voltage source, coupled to the current steering section of at least one differential amplifier stage, for generating a first control signal output proportional to $I_{EXP}$, and a second control signal output proportional to $I_{CONST}-I_{EXP}$, with $I_{CONST}$ being a constant current, and $I_{EXP}$ being exponentially related to an input control voltage $V_{CTRL}$ and independent of temperature, where the first and second control signal outputs control correct steering for the current steering section so that the current steering section has an exponential characteristic, such that the current steering section having said exponential characteristic provides high gain-to-control voltage linearity over a wide dB range.

2. The variable gain amplifier of claim 1, wherein the voltage source includes:

(a) a voltage-to-current converter for converting the input control voltage $V_{CTRL}$ to an output current $I_1$;

(b) a current multiplier/divider, coupled to the voltage-to-current converter, for generating an output $I_{OUT}$ equal to $I_1^*I_2/I_3$, where $I_2$ is generated by a proportional-to-absolute-temperature current source, and $I_3$ is generated by a constant current source;

(c) an exponential current generator, coupled to the current multiplier/divider, for generating $I_{EXP}$ as an exponential function of $I_{OUT}$ and a constant current $I_4$, and independent of temperature; and (d) an output circuit, coupled to the exponential current generator, for generating the first control signal output proportional to $I_{EXP}$ and the second control signal output proportional to $I_{CONST}-I_{EXP}$.

3. The variable gain amplifier of claim 2, wherein the output circuit includes:

(a) a current replicator, coupled to the exponential current generator, for generating two essentially identical output currents equal to $I_{EXP}$;

(b) a current subtractor, coupled to one output of the current replicator, for subtracting $I_{EXP}$ from $I_{CONST}$;

(c) a first current conversion circuit, coupled to the current replicator, for generating the first control signal output proportional to $I_{EXP}$ as a first voltage; and (d) a second current conversion circuit, coupled to the current subtractor, for generating the second control signal output proportional to $I_{CONST}-I_{EXP}$ as a second voltage.

4. A method of varying gain in an amplifier circuit, including the steps of:

applying a differential input signal to a differential amplifier having an amplifier section and a current steering section exhibiting a hyperbolic tangent characteristic;

generating a first control signal output proportional to $I_{EXP}$, and a second control signal output proportional to $I_{CONST}-I_{EXP}$, with $I_{CONST}$ being a constant current, and $I_{EXP}$ being exponentially related to an input control voltage $V_{CTRL}$ and independent of temperature; and exponentially steering the output signal current from the differential amplifier either to a voltage source or to a corresponding output in response to the first and second control signal outputs, where said exponentially steering provides high gain-to-control voltage linearity over a wide dB range.

* * * * *